(12) United States Patent
Mao et al.

(10) Patent No.: US 11,440,836 B2
(45) Date of Patent: Sep. 13, 2022

(54) GLASS COMPOSITION

(71) Applicant: CDGM GLASS CO., LTD, Sichuan (CN)

(72) Inventors: Lulu Mao, Chengdu (CN); Wei Sun, Chengdu (CN); Bo Kuang, Chengdu (CN)

(73) Assignee: CDGM GLASS CO., LTD, Chengdu (CN)

( * ) Notice: Subject to any disclaimer, the term of this patent is extended or adjusted under 35 U.S.C. 154(b) by 0 days.

(21) Appl. No.: 17/050,571

(22) PCT Filed: Apr. 10, 2019

(86) PCT No.: PCT/CN2019/082035
§ 371 (c)(1),
(2) Date: Oct. 26, 2020

(87) PCT Pub. No.: WO2019/205938
PCT Pub. Date: Oct. 31, 2019

(65) Prior Publication Data
US 2021/0238081 A1    Aug. 5, 2021

(30) Foreign Application Priority Data

Apr. 25, 2018 (CN) .......................... 201810380182.8
Apr. 25, 2018 (CN) .......................... 201810380183.2

(51) Int. Cl.

| | |
|---|---|
| *C03C 3/091* | (2006.01) |
| *C03C 3/093* | (2006.01) |
| *C03C 3/095* | (2006.01) |
| *G11B 5/73* | (2006.01) |
| *C03C 8/02* | (2006.01) |
| *C03C 8/04* | (2006.01) |
| *H01L 23/29* | (2006.01) |

(52) U.S. Cl.
CPC .............. *C03C 3/095* (2013.01); *C03C 3/091* (2013.01); *C03C 8/02* (2013.01); *C03C 8/04* (2013.01); *G11B 5/73921* (2019.05); *H01L 23/291* (2013.01)

(58) Field of Classification Search
CPC ......... C03C 3/091; C03C 3/095; C03C 3/093; G11B 5/73921
See application file for complete search history.

(56) References Cited

U.S. PATENT DOCUMENTS

| | | | |
|---|---|---|---|
| 7,754,631 B2 * | 7/2010 | Maehara | C03C 3/091 501/72 |
| 7,838,451 B2 * | 11/2010 | Nishizawa | C03C 3/091 501/65 |
| 2007/0027019 A1 * | 2/2007 | Nishizawa | C03C 3/091 501/65 |
| 2009/0176640 A1 * | 7/2009 | Maehara | C03C 3/091 65/99.2 |
| 2010/0167091 A1 | 7/2010 | Tachiwana et al. | |

FOREIGN PATENT DOCUMENTS

| | | |
|---|---|---|
| CA | 2 236 373 C | 3/2007 |
| CN | 1898168 A | 1/2007 |
| CN | 105948489 A | 9/2016 |
| CN | 108298811 A | 7/2018 |
| JP | S64-61329 A | 3/1989 |
| JP | 2008-150228 A | 7/2008 |

OTHER PUBLICATIONS

Jul. 10, 2019 Search Report issued in International Patent Application No. PCT/CN2019/082035.

\* cited by examiner

*Primary Examiner* — Karl E Group
(74) *Attorney, Agent, or Firm* — Oliff PLC

(57) ABSTRACT

A glass composition with high Young's modulus and low density. The glass composition includes the following components by mole percentage: 52-70% of $SiO_2$, 5-10% of $B_2O_3$, 5-15% of $Al_2O_3$, 8-20% of CaO and 5-18% of MgO. The glass composition uses common chemical raw materials. By reasonably designing the contents of each component, the glass composition has high Young's modulus, low density, good heat resistance and chemical stability, relatively low high-temperature viscosity, and low raw material cost. The glass composition is easy to eliminate stripes and bubbles during manufacturing, and is suitable for hard disk substrate manufacturing other fields that need high Young's modulus materials.

20 Claims, No Drawings

GLASS COMPOSITION

TECHNICAL FIELD

The present invention relates to a glass composition, in particular to a glass composition with high Young's modulus and low density.

BACKGROUND

In recent years, along with the rapid development of industries like cloud storage of big data, higher requirements are posed on the reading speed of hard disk. The most effective way to improve the reading speed of hard disk is to increase the rotation speed of hard disk. At present, the commercial hard disk generally rotates at a speed of 5200 rpm-7200 rpm. If the transmission speed of the hard disk needs to be further increased, the hard disk platter needs to have a rotation speed of over 10000 rpm and keeps unchanged for a long time. The deformation of disk platter under high-speed rotation is a fatal flaw for the hard disk, so very high specific elasticity rate is required for the material used to make the disk platter. The specific elasticity rate refers to the rate of Young's modulus to density of the material. If the specific elasticity rate of the material is larger, the deformation of substrate made of this material will be less during high-speed rotation. Due to low Young's modulus of about 70 GPa, the traditional aluminum alloy disk platter is not suitable for making high-speed hard disk.

For the above reason, the hard disk manufacturer tends to use the glass with high Young's modulus to replace aluminum alloy material for the use in hard disk. For the glass material used as substrate of hard disk, it is generally required that the Young's modulus should be greater than 80 GPa, the shear modulus should be greater than 35 GPa, and the ratio of Young's modulus to density (i.e., $E(GPa)/\rho$) should be greater than 30. In addition, since the magnetic materials need to sputter onto the glass substrate under high temperature environment, the glass needs to have no deformation under the temperature of above 600° C. More importantly, the glass shall not have multiple bubbles. If there are multiple bubbles, the substrate will have disturbance in high-speed rotation. Therefore, such glass should consider lowering the high-temperature viscosity in component design, so as to easily remove bubbles in the production process.

The *Study on Glass Ceramics for HDD Substrate* published in 2003 describes a glass ceramic of $Li_2O$—$Al_2O_3$—$SiO_2$—$P_2O_5$ system, in which the Young's modulus can achieve 100 GPa, and the density is less than 2.60 g/cm³. Such values are very beneficial to increase the rotation speed of the hard disk. However, the mechanism of the glass ceramic is to precipitate crystalline grains that are different from the surrounding glass in the glass component, so as to improve the Young's modulus and strength of the glass, but the ingredients of the precipitated crystalline grains and the surrounding glass are inconsistent, and the processing performance varies greatly. At present, the surface roughness of the hard disk substrate is required to be around 1 Å, while it is very difficult for the glass ceramic to achieve this standard under the current processing conditions. More importantly, if crystalline grain exists in the surface of hard disk substrate, the storage data will be lost. Therefore, the glass ceramic is difficult to be widely used in the field of glass hard disk substrate.

CN1207086A describes a $SiO_2$—$Al_2O_3$—RO alkali-free glass, in which RO refers to alkaline-earth metal oxide, and the Young's modulus can achieve more than 110 GPa. However, the high-temperature viscosity of this kind of glass is very high, and it is very difficult to remove the bubbles. In addition, this kind of glass requires a smelting temperature of about 1600° C., inclusions are easily generated in the glass to result in scrap, and $As_2O_3$ needs to be added as clarifying agent to obtain the glass with relatively good bubbles. This brings two problems. One is that the furnace body working at 1600° C. needs special design, and the time between overhaul is over 50% shorter than that working at 1500° C., which brings more energy consumption and waste discharge; the other is that the addition of $As_2O_3$ into the glass is forbidden according to the existing environmental protection regulations and does not meet the environmental protection requirements.

CN102432171A describes a $SiO_2$—$Al_2O_3$—RO—$R_2O$ system glass, in which RO refers to alkaline-earth metal oxide, $R_2O$ refers to alkali metal oxide containing over 10 mol % of alkali metal, especially containing over 5 mol % of $Li_2O$. A large number of alkali metal oxides can reduce the high-temperature viscosity and easily remove the bubbles, but the heat resistance of the glass will decrease rapidly, and the Tg temperature of the glass will decrease rapidly especially when multiple $Li_2O$ is used, which can reduce the heat resistance of glass substrate, so that higher temperature cannot be borne in the disk manufacturing process. Meanwhile, with the increase of alkali metal content, the water resistance and acid resistance performance of the glass will deteriorate greatly, and the surface quality is easy to be lowered in the process of cleaning during processing. More importantly, during high temperature treatment of the glass containing alkali metal in the process of disk manufacturing, the content of alkali metal is easy to precipitate, which leads to a fatal defect.

SUMMARY

The technical problem to be solved by the present invention is to provide a glass composition with high Young's modulus and low density.

To solve the technical problem, the technical solution of the present invention provides: a glass composition, comprising the following components by mole percentage: 52-70% of $SiO_2$, 5-10% of $B_2O_3$, 5-15% of $Al_2O_3$, 8-20% of CaO and 5-18% of MgO.

Further, the glass composition also comprises: 0-5% of SrO, 0-5% of BaO, 0-5% of ZnO, 0-3% of $La_2O_3$, 0-5% of $Y_2O_3$, 0-10% of $TiO_2$, 0-5% of $ZrO_2$, 0-2% of $Sb_2O_3$, 0-2% of $CeO_2$, and 0-2% of $SnO_2$.

A glass composition, comprising the following components by mole percentage: 52-70% of $SiO_2$, 5-10% of $B_2O_3$, 5-15% of $Al_2O_3$, 8-20% of CaO, 5-18% of MgO, 0-5% of SrO, 0-5% of BaO, 0-5% of ZnO, 0-3% of $La_2O_3$, 0-5% of $Y_2O_3$, 0-10% of $TiO_2$, 0-5% of $ZrO_2$, 0-2% of $Sb_2O_3$, 0-2% of $CeO_2$ and 0-2% of $SnO_2$.

A glass composition, comprising $SiO_2$, $B_2O_3$, $Al_2O_3$, CaO and MgO, wherein Young's modulus of the glass is above 80 GPa, and the density is below 3.10 g/cm³.

Further, the glass composition comprises the following components by mole percentage: 52-70% of $SiO_2$, 5-10% of $B_2O_3$, 5-15% of $Al_2O_3$, 8-20% of CaO, 5-18% of MgO, 0-5% of SrO, 0-5% of BaO, 0-5% of ZnO, 0-3% of $La_2O_3$, 0-5% of $Y_2O_3$, 0-10% of $TiO_2$, 0-5% of $ZrO_2$, 0-2% of $Sb_2O_3$, 0-2% of $CeO_2$, 0-2% of $SnO_2$ and not more than 10% of $R_2O$, wherein $R_2O$ is the total value of $Na_2O$, $K_2O$ and $Li_2O$.

Further, the glass composition comprises 53-65% of $SiO_2$, and/or 5-8% of $B_2O_3$, and/or 7-13% of $Al_2O_3$, and/or 10-18% of CaO, and/or 7-16% of MgO, and/or 0-3% of SrO, and/or 0-3% of BaO, and/or 0-2% of ZnO, and/or 0-1% of $La_2O_3$, and/or 0.2-3% of $Y_2O_3$, and/or 0-5% of $TiO_2$, and/or 0-2% of $ZrO_2$, and/or 0-1% of $Sb_2O_3$, and/or 0-1% of $CeO_2$, and/or 0-1% of $SnO_2$.

Further, the content of each component satisfies one or more of the following 6 conditions:
(1) $SiO_2+Al_2O_3$: 60-75%;
(2) $Al_2O_3/SiO_2$: 0.05-0.30;
(3) $Al_2O_3/B_2O_3$: 0.5-2.5;
(4) CaO/MgO: 0.9-3.5;
(5) $(CaO+MgO+BaO+SrO)/SiO_2$: 0.2-0.7;
(6) $(CaO+MgO)/Al_2O_3$: 1.5-6.0.

Further, the glass composition comprises 54-62% of $SiO_2$, and/or 5-7% of $B_2O_3$, and/or 8-12% of $Al_2O_3$, and/or 12-17% of CaO, and/or 8-15% of MgO, and/or 0-1% of BaO, and/or 0.3-1% of $Y_2O_3$, and/or 0-2% of $TiO_2$, and/or 0-0.5% of $Sb_2O_3$, and/or 0-0.5% of $CeO_2$, and/or 0-0.5% of $SnO_2$.

Further, the content of each component satisfies one or more of the following 6 conditions:
(1) $SiO_2 \pm Al_2O_3$: 62-73%;
(2) $Al_2O_3/SiO_2$: 0.10-0.25;
(3) $Al_2O_3/B_2O_3$: 0.8-1.8;
(4) CaO/MgO: 1.0-2.5;
(5) $(CaO+MgO+BaO+SrO)/SiO_2$: 0.3-0.6;
(6) $(CaO+MgO)/Al_2O_3$: 2.0-5.5.

Further, the content of each component satisfies one or more of the following 6 conditions:
(1) $SiO_2 \pm Al_2O_3$: 64-70%;
(2) $Al_2O_3/SiO_2$: 0.15-0.20;
(3) $Al_2O_3/B_2O_3$: 1.0-1.6;
(4) CaO/MgO: 1.1-2.0;
(5) $(CaO+MgO+BaO+SrO)/SiO_2$: 0.4-0.6;
(6) $(CaO+MgO)/Al_2O_3$: 2.5-5.0.

Further, the glass composition above comprises not more than 10% of $R_2O$, preferably not more than 5%, more preferably not more than 3%, further preferably not more than 1%, wherein $R_2O$ is the total value of $Na_2O$, $K_2O$ and $Li_2O$.

Further, the Young's modulus of the glass composition above is 80-100 GPa, preferably 82-100 Gpa, more preferably 84-100 GPa; the density is below 2.80 g/cm³, preferably below 2.70 g/cm³, further preferably below 2.65 g/cm³.

Further, water durability of the glass composition above is Class 2 and above, preferably Class 1; acid durability is Class 2 and above, preferably Class 1.

Further, the transition temperature of the glass composition above is above 670° C., preferably above 675° C., more preferably above 680° C.; the viscosity of the glass at a molten state of 1400° C. is below 400P, preferably below 350P, and more preferably below 300P.

A hard disk substrate, formed by the above glass composition.

Application of the above glass composition for the semiconductor sealing.

The beneficial effects of the present invention are as follows: the present invention uses common chemical raw materials. By reasonably designing the contents of each component, the glass composition provided by the present invention has high Young's modulus, low density, good heat resistance and chemical stability, relatively low high-temperature viscosity, and low raw material cost. The glass composition is easy to eliminate stripes and bubbles during manufacturing, and is suitable for hard disk substrate manufacturing other fields that need high Young's modulus materials.

DETAILED DESCRIPTION

Each component of the glass provided by the present invention is described hereunder, and the content of each component is represented by mol % unless otherwise stated.

$SiO_2$ is the main network former of the glass and the framework that forms the glass. In the glass provided by the present invention, when the content of $SiO_2$ is higher than 70%, the melting performance of the glass will decrease, and the high-temperature viscosity will rise sharply; when the content of $SiO_2$ is lower than 52%, the chemical stability of the glass will be reduced, and the density of the glass is beyond the design expectation. Therefore, in order to maintain better chemical properties, obtain lower high-temperature viscosity, obtain lower density and maintain better chemical stability, the content of $SiO_2$ needs to be confined to 52-70%, preferably 53-65%, and further preferably 54-62%.

$B_2O_3$ is also one of glass formers, and meanwhile also a good cosolvent. Adding an appropriate amount of $B_2O_3$ can significantly improve the melting performance of glass raw material, reduce the density of the glass, and reduce the high-temperature viscosity of the glass. However, excessive addition of $B_2O_3$ into the glass will significantly reduce the Young's modulus of the glass and reduce the chemical stability of the glass. Therefore, if the addition of $B_2O_3$ is less than 5%, the glass raw material will become extremely difficult to melt, the high-temperature viscosity of the glass will increase, and the bubbles are not easy to be removed in the production process; if the addition of $B_2O_3$ is higher than 10%, the Young's modulus of the glass will be significantly reduced, and the chemical stability of the glass, especially the water resistance, will be reduced. Therefore, the content thereof is confined to 5-10%, preferably 5-8%, further preferably 5-7%.

The addition of $Al_2O_3$ into the glass provided by the present invention can increase the Young's modulus of the glass, and meanwhile reduce the density of the glass. If the content thereof is less than 5%, the Young's modulus of the glass will be lower than the design expectation, and the density of the glass will increase; if the content thereof is higher than 15%, the $Al_2O_3$ is very insoluble, which will cause the rapid decrease of melting performance of the glass raw material as well as the sharp rise of high-temperature viscosity of glass. Therefore, in order to balance the Young's modulus, density, melting performance and high-temperature viscosity of the glass, the addition of $Al_2O_3$ is confined to 5-15%, preferably 7-13%, further preferably 8-12%.

Further, the inventor finds through a large number of experiments that the above three oxides are main components of the glass framework, and their proportion has a significant impact on the structure of the glass, thereby having a strong correlation with the properties of the glass, such as melting performance, high-temperature viscosity, Young's modulus, density, chemical stability and heat resistance.

In the present invention, both $SiO_2$ and $Al_2O_3$ are refractory oxides. If the total content of $SiO_2+Al_2O_3$ exceeds 75%, the melting performance of the glass will decrease sharply, the high-temperature viscosity will increase, and the glass is easy to produce infusible matters and bubbles. If the total content of $SiO_2+Al_2O_3$ is lower than 60%, the Young's modulus and chemical stability of the glass will fail to meet the design requirements. In order to ensure the melting performance and Young's modulus, $SiO_2+Al_2O_3$ is 60-75%, preferably 62-73%, further preferably 64-70%.

More importantly, in this system glass, it is generally considered in the prior art that the melting performance and high-temperature viscosity of the glass increase in linear form along with the increase of $Al_2O_3$. The inventor finds through a large number of experiments that the melting performance of the glass decreases sharply in linear form along with the increase of $Al_2O_3$ content when the ratio of $Al_2O_3$ to $SiO_2$ ($Al_2O_3/SiO_2$) is 0-0.05; but when $Al_2O_3/SiO_2$ is 0.05-0.30, the high-temperature viscosity of the glass no longer increases sharply, and the melting performance of the glass also has no significant decrease; when the value of $Al_2O_3/SiO_2$ exceeds 0.30, the high-temperature viscosity of the glass continues to rise sharply, and the solubility of the glass continues to decrease sharply. In short, when $Al_2O_3/SiO_2$ is 0.05-0.30, the solubility and high-temperature viscosity of the glass change little with the increase of $Al_2O_3$. Meanwhile, the inventor also finds that when $Al_2O_3/SiO_2$ is 0.05-0.30, the Young's modulus and heat resistance of the glass increase sharply with the increase of the value of $Al_2O_3/SiO_2$. Therefore, when $Al_2O_3/SiO_2$ is 0.05-0.30, preferably 0.10-0.25, further preferably 0.15-0.20, high Young's modulus and good heat resistance can be obtained, and meanwhile, the high-temperature viscosity of the glass is relatively low, and the melting performance is relatively good.

Further, $Al_2O_3$ and $B_2O_3$ have structural change in this system glass along with the change of glass components. In the prior art, it is considered that the addition of $B_2O_3$ can improve the melting performance of the glass and reduce the high-temperature viscosity, but the Young's modulus of the glass can be reduced. Therefore, in order to obtain the glass with high Young's modulus, the melting performance and high-temperature viscosity are generally sacrificed in the prior art. The glass with high Young's modulus is obtained by reducing the introduction of $B_2O_3$, or even no addition of $B_2O_3$. However, the inventor finds that when the ration of $Al_2O_3$ to $B_2O_3$ ($Al_2O_3/B_2O_3$) is 0.5-2.5, preferably 0.8-1.8, further preferably 1.0-1.6, the glass can achieve the designed Young's modulus, and can obtain relatively good melting performance and relatively low iii high-temperature viscosity.

CaO, MgO, SrO, and BaO are alkaline-earth metal oxides. Adding an appropriate amount of alkaline-earth metal oxides into the glass can increase the Young's modulus of the glass, reduce the high-temperature viscosity of the glass, and meanwhile balance the glass components to improve the melting performance of the glass. However, excessive alkaline-earth metal oxides will reduce the devitrification resistance performance of glass. The devitrification resistance performance of glass is very important for the glass of hard disk substrate, because in the process of making the blank hard disk substrate, the glass block needs to be softened near the softening point of glass and pressed into a thin blank. If the glass's devitrification resistance performance is not good, devitrification particles will be generated in the glass. The physical properties of the hardness of the devitrification particles are vastly different from those of the surrounding glass, which will cause defects during processing and make the surface roughness of the substrate fail to meet the requirements. Therefore, when the value of (CaO+MgO+BaO+SrO)/$SiO_2$ in the present invention is 0.2-0.7, preferably 0.3-0.6, further preferably 0.4-0.6, the devitrification resistance performance, high-temperature viscosity and Young's modulus of the glass are the most balanced.

The above four alkaline-earth metal oxides have common feature in reducing high temperature viscosity and improving the melting performance of glass, but with inconsistent and significantly different ability of reducing high-temperature viscosity and extent of the effect on the devitrification resistance performance of glass and the glass density as well as improvement in the Young's modulus and heat resistance.

According to the researches conducted by the inventor, it is found that the addition of MgO into glass can increase the Young's modulus of the glass and reduce the high-temperature viscosity of the glass, but if the content of MgO is less than 5%, the effect of reducing the density and increasing the Young's modulus is not obvious; if the content of MgO is more than 18%, the devitrification resistance performance of the glass will be significantly reduced. Therefore, the content thereof is confined to 5-8%, preferably 7-16%, further preferably 8-15%.

CaO plays the most obvious role in reducing the high-temperature viscosity among these four alkaline-earth metal oxides; at the same time, CaO can increase the Young's modulus of the glass. Compared with MgO, CaO has slightly lower effect of increasing Young's modulus, and slightly lower capacity of reducing the density of glass. In the present invention, if the addition of CaO is less than 8%, the Young's modulus of the glass cannot meet the design requirements, and the effect of reducing the high-temperature viscosity of the glass is not obvious; if the content of CaO is higher than 20%, the devitrification resistance performance of the glass will decrease sharply, and meanwhile, the chemical stability of the glass, especially the water resistance, will decrease rapidly. Therefore, the content thereof is confined to 8-20%, preferably 10-18%, further preferably 12-17%.

The ability of SrO to increase the Young's modulus and reduce the density of the glass is inferior to that of Cao and MgO. Adding a small amount of SrO can improve the devitrification resistance performance of the glass. If the content of SrO is higher than 5%, the devitrification resistance capacity of the glass will decrease, the chemical stability will decrease, and the cost of glass will increase significantly. Therefore, the content thereof is confined to 0-5%, preferably 0-3%, further preferably 0%.

Compared with the other three alkaline-earth metal oxides, BaO can significantly increase the density of the glass and meanwhile cause the significant decrease of the chemical stability of the glass. A small amount of BaO addition can improve the Young's modulus and devitrification resistance performance of the glass, but if the content of BaO is more than 5%, the density of the glass will increase significantly, and the chemical stability, especially the water resistance, will decrease significantly. Therefore, the content thereof is confined to 0-5%, preferably 0-3%, more preferably 0-1%, further preferably 0%.

Further, the inventor finds through a large number of experiments that when Cao and MgO coexist and the ratio of Cao to MgO (CaO/MgO) is 0.9-3.0, the internal structure of the glass will change toward the compact direction compared with the structure of adding some alkaline-earth metal oxide alone, which will result in high Young's modulus, strong devitrification resistance performance of the glass, as well as low high-temperature viscosity and good chemical stability. Therefore, the value of CaO/MgO is confined to 0.9-3.5, preferably 1.0-2.5, further preferably 1.1-2.0.

Furthermore, the inventor finds that the Young's modulus, high-temperature viscosity, density and chemical stability of the glass are significantly related to the total value of CaO and MgO in the glass as well we the relative content of $Al_2O_3$. The reason is that the content of such two main alkaline-earth metal oxides will lead to significant changes in the structure of $Al_2O_3$ in the glass, thereby resulting in the change of Young's modulus, high-temperature viscosity, density, chemical stability and other properties of the glass. When the ratio of the total value of CaO and MgO to $Al_2O_3$ (CaO+MgO)/$Al_2O_3$) is 1.5-6.0, preferably 2.0-5.5, further preferably 2.5-5.0, the Young's modulus, high-temperature viscosity, density, chemical stability and other key indicators of the glass are the most balanced.

Adding a small amount of ZnO into the glass can improve the devitrification resistance temperature and chemical stability of the glass, and meanwhile reduce the high-temperature viscosity of the glass. If the content thereof is more than 5%, the density of the glass will increase significantly and cannot meet the design requirements. Therefore, the content thereof is confined to 0-5%, preferably 0-2%, further preferably 0%.

Adding a small amount of $ZrO_2$ into the glass can improve the devitrification resistance and chemical stability of the glass. However, if the content thereof is more than 5%, the solubility of the glass will be significantly reduced, and meanwhile the high-temperature viscosity of the glass will be significantly increased, and insoluble substances are easy to appear in the glass. Therefore, the content thereof is confined to 0-5%, preferably 0-2%, further preferably 0%.

Adding a small amount of $La_2O_3$ into the glass can increase the Young's modulus of the glass, and meanwhile increase the Tg temperature of the glass, improve the heat resistance of the glass and reduce the high-temperature viscosity of the glass. If the content thereof is more than 3%, the density of the glass will increase significantly and cannot meet the design requirements; meanwhile, the devitrification resistance performance of the glass will decrease significantly. Therefore, the content thereof is confined to 0-3%, preferably 0-1%, further preferably 0%.

A small amount of $Y_2O_3$ addition into the glass can significantly increase the Young's modulus and heat resistance of the glass, and meanwhile reduce the high-temperature viscosity of the glass, so that the bubbles can be easily removed. If the content thereof is more than 5%, the devitrification resistance performance of the glass will decrease significantly, and the density will increase significantly. Therefore, the content thereof is confined to 0-5%, preferably 0.2-3%, further preferably 0.3-1%.

A small amount of $TiO_2$ addition into the glass can significantly increase the Young's modulus of the glass, and meanwhile reduce the high-temperature viscosity of the glass. However, if the content thereof is more than 10%, the devitrification resistance performance of the glass will decrease significantly, and meanwhile, the structure of $Al_2O_3$ will change toward the loose direction, resulting in the decrease of Young's modulus. In addition, adding excessive $TiO_2$ into the glass will lead to rapid decrease of blue visible light transmittance of the glass, so that the glass is not suitable for applications requiring high blue band transmittance. Therefore, the content thereof is confined to 0-10%, preferably 0-5%, further preferably 0-2%.

In the present invention, the total value of alkali metal oxides $Na_2O$, $K_2O$ and $Li_2O$ is called $R_2O$. Adding alkali metal oxide into the glass provided by the present invention can reduce the high-temperature viscosity and improve the chemical properties of the glass, so that the bubbles and inclusions in the glass can be easier to be removed. For the purpose of the present invention, if the total amount of alkali metal oxides exceeds 10%, the Tg temperature of the glass will decrease sharply. More importantly, the glass substrate is easier to precipitate alkali metal ions in the manufacturing process, which will pollute the magnetic medium layer of the disk platter and lead to the scrapping of the products. In consideration of reducing the difficulty of glass production, it is necessary to add certain alkali metal oxide, but the content of $R_2O$ is not more than 10%, preferably not more than 5%, more preferably not more than 3%, further preferably not more than 1%. In addition, considering the types of alkali metal oxide, $Li_2O$ is preferred, followed by $Na_2O$, and $K_2O$ should not be selected as much as possible.

In addition, 0-2% clarifying agent can be introduced into the glass provided by the present invention, preferably 0-1%, further preferably 0-0.5. These clarifying agents can select $Sb_2O_3$, or/and $CeO_2$, or/and $SnO_2$.

In the following paragraphs, the performance of optical glass provided in this invention will be described:

[Young's Modulus]

The Young's modulus (E) of the glass is tested by ultrasonic wave for P-wave velocity and S-wave velocity, and then calculated according to the following formula.

$$E = \frac{4G^2 - 3GV_T^2\rho}{G - V_T^2\rho}$$

Where: $G=V_S^2\rho$ in which:

E refers to Young's modulus, Pa;

G refers to shear modulus, Pa;

$V_T$ refers to S-wave velocity, m/s;

$V_S$ refers to P-wave velocity, m/s;

$\rho$ refers to glass density, g/cm$^3$;

[Density of Glass]

The density ($\rho$) of the glass is tested according to the method specified in GB/T7962.20-2010.

[Transition Temperature]

The Transition temperature (Tg) of the glass is tested according to the method specified in GB/T7962.16-2010.

[High-Temperature Viscosity]

The high-temperature viscosity of the glass (unit: dPaS/P) is measured by THETA Rheotronic II high temperature viscometer with rotation method. The smaller the value is, the smaller the viscosity is.

[Chemical Stability]

The water durability ($D_W$) of the glass is tested according to the method specified in GB/T17129.

The acid durability ($D_A$) of the glass is tested according to the method specified in GB/T17129.

Upon the test, the optical glass provided by the present invention has the following properties: the Young's modulus (E) of the glass is above 80 GPa, preferably 80-100 GPa, more preferably 82-100 GPa, further preferably 84-100 GPa; the density ($\rho$) of the glass is below 3.10 g/cm$^3$, preferably below 2.80 g/cm$^3$, more preferably below 2.7 g/cm$^3$, further preferably below 2.65 g/cm$^3$; the transition temperature (Tg) of the glass is above 670° C., preferably above 675° C., further preferably above 680° C.; the viscosity (K) of the glass at the molten state of 1400° C. is below 400P, preferably below 350P, further preferably below 300P; the powder-method water durability ($D_W$) of the glass is Class 2 and above, preferably Class 1; the powder-method acid durability ($D_A$) is Class 2 and above, preferably Class 1.

Due to the above properties, the optical glass provided by the present invention can be used for making a hard disk substrate and can be applied in semiconductor sealing.

Embodiment

To further understand the technical solution of the present invention, embodiments of optical glass provided by the present invention are described as below. What shall be noted is that these embodiments do not limit the scope of the present invention.

The optical glasses (embodiments 1-20) shown in Table 1 are formed by weighing based on the proportions of each embodiment in Table 1, mixing the ordinary raw materials for optical glass (such as oxide, hydroxide, carbonate and nitrate), placing the mixed raw materials in a platinum crucible, melting for 4-6 hours at the temperature of 1400-1500° C., obtaining homogeneous molten glass without bubbles and undissolved substances after clarification, stirring and homogenization, shaping the molten glass in a mould and performing annealing.

In the present invention, the composition of embodiments 1-20 and Young's modulus (E), density (ρ), transition temperature (Tg), viscosity (K) at the temperature of 1400° C., water durability ($D_W$), acid durability ($D_A$) and $SiO_2+Al_2O_3$ are represented by A, $Al_2O_3/SiO_2$ is represented by B, $Al_2O_3/B_2O_3$ is represented by C, CaO/MgO is represented by D, $(CaO+MgO+BaO+SrO)/SiO_2$ is represented by F, and $(CaO+MgO)/Al_2O_3$ is represented by G

TABLE 1

| Component | Embodiments | | | | | | | | | |
|---|---|---|---|---|---|---|---|---|---|---|
| (mol %) | 1 | 2 | 3 | 4 | 5 | 6 | 7 | 8 | 9 | 10 |
| $SiO_2$ | 57.00 | 56.00 | 52.50 | 65.00 | 68.00 | 53.00 | 55.00 | 58.00 | 57.50 | 57.00 |
| $B_2O_3$ | 5.40 | 6.00 | 9.80 | 5.20 | 9.80 | 6.00 | 6.50 | 5.10 | 6.10 | 9.50 |
| ZnO | 0.00 | 0.50 | 2.00 | 0.00 | 0.50 | 0.50 | 0.00 | 0.00 | 1.00 | 0.00 |
| $TiO_2$ | 0.00 | 0.50 | 1.00 | 0.20 | 0.00 | 0.00 | 0.00 | 0.00 | 0.00 | 0.00 |
| $Al_2O_3$ | 9.10 | 8.70 | 9.00 | 6.00 | 5.20 | 14.90 | 5.50 | 8.50 | 7.50 | 8.50 |
| $ZrO_2$ | 0.00 | 0.50 | 0.20 | 0.00 | 0.00 | 0.00 | 0.00 | 0.30 | 2.00 | 0.00 |
| $Y_2O_3$ | 0.30 | 0.50 | 0.50 | 0.20 | 0.20 | 0.50 | 0.50 | 0.40 | 0.50 | 0.50 |
| $La_2O_3$ | 0.00 | 0.00 | 0.50 | 0.00 | 0.50 | 0.00 | 0.00 | 0.20 | 0.20 | 0.00 |
| CaO | 15.40 | 14.80 | 11.50 | 17.80 | 9.00 | 18.00 | 19.40 | 15.00 | 14.00 | 14.00 |
| MgO | 12.00 | 11.80 | 11.30 | 5.10 | 5.50 | 6.50 | 12.00 | 12.10 | 11.00 | 10.00 |
| BaO | 0.40 | 0.00 | 0.00 | 0.00 | 1.00 | 0.00 | 0.00 | 0.00 | 0.00 | 0.00 |
| SrO | 0.00 | 0.00 | 1.00 | 0.00 | 0.00 | 0.20 | 0.50 | 0.00 | 0.00 | 0.00 |
| $CeO_2$ | 0.10 | 0.10 | 0.20 | 0.00 | 0.10 | 0.10 | 0.10 | 0.00 | 0.00 | 0.10 |
| $SnO_2$ | 0.10 | 0.20 | 0.20 | 0.20 | 0.10 | 0.20 | 0.20 | 0.00 | 0.00 | 0.10 |
| $Sb_2O_3$ | 0.20 | 0.40 | 0.30 | 0.30 | 0.10 | 0.10 | 0.30 | 0.40 | 0.20 | 0.30 |
| Total (%) | 100.00 | 100.00 | 100.00 | 100.00 | 100.00 | 100.00 | 100.00 | 100.00 | 100.00 | 100.00 |
| A | 66.10 | 64.70 | 61.50 | 71.00 | 73.20 | 67.90 | 60.50 | 66.50 | 65.00 | 65.50 |
| B | 0.16 | 0.16 | 0.17 | 0.09 | 0.08 | 0.28 | 0.10 | 0.15 | 0.13 | 0.15 |
| C | 1.69 | 1.45 | 0.92 | 1.15 | 0.53 | 2.48 | 0.85 | 1.67 | 1.23 | 0.89 |
| D | 1.28 | 1.25 | 1.02 | 3.49 | 1.64 | 2.77 | 1.62 | 1.24 | 1.27 | 1.40 |
| F | 0.49 | 0.48 | 0.45 | 0.35 | 0.23 | 0.47 | 0.58 | 0.47 | 0.43 | 0.42 |
| G | 3.01 | 3.06 | 2.53 | 3.82 | 2.79 | 1.64 | 5.71 | 3.19 | 3.33 | 2.82 |
| E (GPa) | 89.10 | 88.60 | 87.82 | 88.50 | 85.70 | 91.50 | 94.20 | 89.80 | 91.10 | 86.40 |
| ρ (g/cm³) | 2.60 | 2.62 | 2.65 | 2.64 | 2.52 | 2.61 | 2.68 | 2.61 | 2.64 | 2.57 |
| Tg (° C.) | 710 | 700 | 711 | 720 | 698 | 705 | 721 | 715 | 726 | 695 |
| K (P) | 250.0 | 271.0 | 215.0 | 325.0 | 395.0 | 325.0 | 215.0 | 265.0 | 301.0 | 220.1 |
| $D_W$ | 1 | 1 | 1 | 1 | 1 | 1 | 1 | 1 | 1 | 1 |
| $D_A$ | 1 | 1 | 1 | 1 | 1 | 1 | 1 | 1 | 1 | 1 |

TABLE 2

| Component | Embodiments | | | | | | | | | |
|---|---|---|---|---|---|---|---|---|---|---|
| (mol %) | 11 | 12 | 13 | 14 | 15 | 16 | 17 | 18 | 19 | 20 |
| $SiO_2$ | 58.00 | 56.00 | 54.00 | 60.00 | 63.00 | 57.20 | 56.70 | 56.20 | 55.60 | 54.50 |
| $B_2O_3$ | 5.40 | 6.40 | 7.20 | 5.20 | 6.50 | 5.40 | 5.70 | 6.20 | 6.80 | 6.80 |
| ZnO | 0.00 | 0.00 | 1.00 | 0.00 | 0.00 | 0.00 | 0.00 | 0.00 | 0.20 | 0.00 |
| $TiO_2$ | 0.00 | 0.00 | 0.00 | 0.50 | 0.00 | 0.00 | 0.00 | 0.00 | 0.30 | 0.00 |
| $Al_2O_3$ | 8.10 | 9.50 | 9.10 | 9.20 | 8.50 | 8.50 | 8.80 | 9.10 | 8.90 | 9.50 |
| $ZrO_2$ | 0.00 | 0.00 | 0.00 | 0.20 | 0.00 | 0.00 | 0.00 | 0.00 | 0.30 | 0.00 |
| $Y_2O_3$ | 0.50 | 0.50 | 0.80 | 0.50 | 0.70 | 0.50 | 0.50 | 0.30 | 0.50 | 0.30 |
| $La_2O_3$ | 0.00 | 0.00 | 0.50 | 0.00 | 0.00 | 0.00 | 0.00 | 0.00 | 0.10 | 0.00 |
| CaO | 15.80 | 14.80 | 16.00 | 14.00 | 13.00 | 14.40 | 14.90 | 15.40 | 15.00 | 15.50 |
| MgO | 11.40 | 12.40 | 11.00 | 10.00 | 8.00 | 13.00 | 12.50 | 12.00 | 11.90 | 13.00 |
| BaO | 0.40 | 0.00 | 0.00 | 0.00 | 0.00 | 0.50 | 0.00 | 0.40 | 0.00 | 0.00 |
| SrO | 0.00 | 0.00 | 0.00 | 0.00 | 0.00 | 0.20 | 0.50 | 0.00 | 0.00 | 0.00 |

TABLE 2-continued

| Component (mol %) | Embodiments | | | | | | | | | |
|---|---|---|---|---|---|---|---|---|---|---|
| | 11 | 12 | 13 | 14 | 15 | 16 | 17 | 18 | 19 | 20 |
| $CeO_2$ | 0.10 | 0.10 | 0.10 | 0.00 | 0.00 | 0.10 | 0.10 | 0.10 | 0.00 | 0.10 |
| $SnO_2$ | 0.10 | 0.10 | 0.00 | 0.10 | 0.00 | 0.10 | 0.10 | 0.10 | 0.10 | 0.10 |
| $Sb_2O_3$ | 0.20 | 0.20 | 0.30 | 0.30 | 0.30 | 0.10 | 0.20 | 0.20 | 0.30 | 0.20 |
| Total (%) | 100.00 | 100.00 | 100.00 | 100.00 | 100.00 | 100.00 | 100.00 | 100.00 | 100.00 | 100.00 |
| A | 66.10 | 65.50 | 63.10 | 69.20 | 71.50 | 65.70 | 65.50 | 65.30 | 64.50 | 64.00 |
| B | 0.14 | 0.17 | 0.17 | 0.15 | 0.13 | 0.15 | 0.16 | 0.16 | 0.16 | 0.17 |
| C | 1.50 | 1.48 | 1.26 | 1.77 | 1.31 | 1.57 | 1.54 | 1.47 | 1.31 | 1.40 |
| D | 1.39 | 1.19 | 1.45 | 1.40 | 1.63 | 1.11 | 1.19 | 1.28 | 1.26 | 1.19 |
| F | 0.48 | 0.49 | 0.50 | 0.40 | 0.33 | 0.49 | 0.49 | 0.49 | 0.48 | 0.52 |
| G | 3.36 | 2.86 | 2.97 | 2.61 | 2.47 | 3.22 | 3.11 | 3.01 | 3.02 | 3.00 |
| E (GPa) | 88.40 | 89.60 | 91.20 | 87.20 | 86.80 | 89.50 | 90.10 | 88.80 | 90.40 | 90.80 |
| ρ (g/cm³) | 2.59 | 2.60 | 2.63 | 2.57 | 2.55 | 2.61 | 2.62 | 2.62 | 2.62 | 2.63 |
| Tg (° C.) | 705 | 712 | 720 | 687 | 690 | 715 | 720 | 710 | 718 | 722 |
| K (P) | 240.0 | 261.0 | 230.0 | 320.0 | 357.0 | 230.0 | 225.0 | 250.0 | 223.0 | 215.0 |
| $D_W$ | 1 | 1 | 1 | 1 | 1 | 1 | 1 | 1 | 1 | 1 |
| $D_A$ | 1 | 1 | 1 | 1 | 1 | 1 | 1 | 1 | 1 | 1 |

The invention claimed is:

1. A glass composition, comprising the following components by mole percentage: 52-70% of $SiO_2$, 5-10% of $B_2O_3$, 5-12% of $Al_2O_3$, 8-20% of CaO and 5-18% of MgO; wherein CaO/MgO: 0.9-2.0, and (CaO+MgO)/$Al_2O_3$: 2.5-6.0.

2. The glass composition according to claim 1, further comprising: 0-5% of SrO, 0-5% of BaO, 0-5% of ZnO, 0-3% of $La_2O_3$, 0-5% of $Y_2O_3$, 0-10% of $TiO_2$, 0-5% of $ZrO_2$, 0-2% of $Sb_2O_3$, 0-2% of $CeO_2$, and 0-2% of $SnO_2$.

3. A glass composition, consisting of the following components by mole percentage: 52-70% of $SiO_2$, 5-10% of $B_2O_3$, 5-12% of $Al_2O_3$, 8-20% of CaO, 5-18% of MgO, 0-5% of SrO, 0-5% of BaO, 0-5% of ZnO, 0-3% of $La_2O_3$, 0-5% of $Y_2O_3$, 0-10% of $TiO_2$, 0-5% of $ZrO_2$, 0-2% of $Sb_2O_3$, 0-2% of $CeO_2$ and 0-2% of $SnO_2$; wherein CaO/MgO: 0.9-2.0, and (CaO+MgO)/$Al_2O_3$: 2.5-6.0.

4. A glass composition, comprising the following components by mole percentage: 52-70% of $SiO_2$, 5-10% of $B_2O_3$, 5-12% of $Al_2O_3$, 8-20% of CaO and 5-18% of MgO, wherein Young's modulus of the glass is above 80 GPa, the density is below 3.10 g/cm³, CaO/MgO: 0.9-2.0, and (CaO+MgO)/$Al_2O_3$: 2.5-6.0.

5. The glass composition according to claim 4, comprising the following components by mole percentage: 52-70% of $SiO_2$, 5-10% of $B_2O_3$, 5-12% of $Al_2O_3$, 8-20% of CaO, 5-18% of MgO, 0-5% of SrO, 0-5% of BaO, 0-5% of ZnO, 0-3% of $La_2O_3$, 0-5% of $Y_2O_3$, 0-10% of $TiO_2$, 0-5% of $ZrO_2$, 0-2% of $Sb_2O_3$, 0-2% of $CeO_2$, 0-2% of $SnO_2$ and not more than 10% of $R_2O$, wherein $R_2O$ is the total value of $Na_2O$, $K_2O$ and $Li_2O$.

6. The glass composition according to claim 1, comprising 53-65% of $SiO_2$, and/or 5-8% of $B_2O_3$, and/or 7-12% of $Al_2O_3$, and/or 10-18% of CaO, and/or 7-16% of MgO, and/or 0-3% of SrO, and/or 0-3% of BaO, and/or 0-2% of ZnO, and/or 0-1% of $La_2O_3$, and/or 0.2-3% of $Y_2O_3$, and/or 0-5% of $TiO_2$, and/or 0-2% of $ZrO_2$, and/or 0-1% of $Sb_2O_3$, and/or 0-1% of $CeO_2$, and/or 0-1% of $SnO_2$.

7. The glass composition according to claim 1, wherein the content of each component satisfies one or more of the following 4 conditions:
(1) $SiO_2+Al_2O_3$: 60-75%;
(2) $Al_2O_3/SiO_2$: 0.05-0.30;
(3) $Al_2O_3/B_2O_3$: 0.5-2.5;
(4) (CaO+MgO+BaO+SrO)/$SiO_2$: 0.2-0.7.

8. The glass composition according to claim 1, comprising 54-62% of $SiO_2$, and/or 5-7% of $B_2O_3$, and/or 8-12% of $Al_2O_3$, and/or 12-17% of CaO, and/or 8-15% of MgO, and/or 0-1% of BaO, and/or 0.3-1% of $Y_2O_3$, and/or 0-2% of $TiO_2$, and/or 0-0.5% of $Sb_2O_3$, and/or 0-0.5% of $CeO_2$, and/or 0-0.5% of $SnO_2$.

9. The glass composition according to claim 1, wherein the content of each component satisfies one or more of the following 6 conditions:
(1) $SiO_2+Al_2O_3$: 62-73%;
(2) $Al_2O_3/SiO_2$: 0.10-0.25;
(3) $Al_2O_3/B_2O_3$: 0.8-1.8;
(4) CaO/MgO: 1.0-2.0;
(5) (CaO+MgO+BaO+SrO)/$SiO_2$: 0.3-0.6;
(6) (CaO+MgO)/$Al_2O_3$: 2.5-5.5.

10. The glass composition according to claim 1, wherein the content of each component satisfies one or more of the following 6 conditions:
(1) $SiO_2+Al_2O_3$: 64-70%;
(2) $Al_2O_3/SiO_2$: 0.15-0.20;
(3) $Al_2O_3/B_2O_3$: 1.0-1.6;
(4) CaO/MgO: 1.1-2.0;
(5) (CaO+MgO+BaO+SrO)/$SiO_2$: 0.4-0.6;
(6) (CaO+MgO)/$Al_2O_3$: 2.5-5.0.

11. The glass composition according to claim 1, comprising not more than 10% of $R_2O$, wherein $R_2O$ is the total value of $Na_2O$, $K_2O$ and $Li_2O$.

12. The glass composition according to claim 1, comprising not more than 1% of $R_2O$, wherein $R_2O$ is the total value of $Na_2O$, $K_2O$ and $Li_2O$.

13. The glass composition according to claim 1, wherein the Young's modulus of the glass is 80-100 GPa; the density is below 2.80 g/cm³.

14. The glass composition according to claim 1, wherein the Young's modulus of the glass is 84-100 GPa; the density is below 2.65 g/cm³.

15. The glass composition according to claim 1, wherein water durability of the glass is Class 2 and above; acid durability is Class 2 and above.

16. The glass composition according to claim 1, wherein water durability of the glass is Class 1; acid durability is Class 1.

17. The glass composition according to claim 1, wherein the transition temperature of the glass is above 670° C.; the viscosity of the glass at a molten state of 1400° C. is below 400P.

18. The glass composition according to claim 1, wherein the transition temperature of the glass is above 680° C.; the viscosity of the glass at a molten state of 1400° C. is below 300P.

19. A hard disk substrate, formed by the glass composition according to claim 1.

20. A method for sealing a semiconductor comprising: applying the glass composition according to claim 1 to a surface of the semiconductor.

* * * * *